(12) United States Patent
Kim

(10) Patent No.: US 12,033,961 B2
(45) Date of Patent: Jul. 9, 2024

(54) SEMICONDUCTOR PACKAGE INCLUDING REINFORCEMENT PATTERN

(71) Applicant: Samsung Electronics Co., Ltd., Suwon-si (KR)

(72) Inventor: Joongsun Kim, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 266 days.

(21) Appl. No.: 17/575,890

(22) Filed: Jan. 14, 2022

(65) Prior Publication Data
US 2022/0399286 A1 Dec. 15, 2022

(30) Foreign Application Priority Data
Jun. 14, 2021 (KR) .................. 10-2021-0076837

(51) Int. Cl.
*H01L 23/00* (2006.01)
*H01L 23/31* (2006.01)
*H01L 23/498* (2006.01)

(52) U.S. Cl.
CPC ........ *H01L 23/562* (2013.01); *H01L 23/3128* (2013.01); *H01L 23/49811* (2013.01); *H01L 23/49822* (2013.01); *H01L 23/49838* (2013.01); *H01L 24/08* (2013.01); *H01L 2224/08235* (2013.01)

(58) Field of Classification Search
CPC .............. H01L 23/562; H01L 23/3128; H01L 23/49811; H01L 23/49822; H01L 23/49838; H01L 24/08
See application file for complete search history.

(56) References Cited

U.S. PATENT DOCUMENTS

| 8,269,346 | B2 | 9/2012 | Seta et al. |
| 8,704,354 | B2 | 4/2014 | Cheng et al. |
| 9,502,363 | B2 | 11/2016 | Vincent et al. |
| 10,079,225 | B2 | 9/2018 | Lin et al. |
| 10,163,813 | B2 | 12/2018 | Lin et al. |
| 2015/0270233 | A1* | 9/2015 | Vincent .................. H01L 24/02 257/773 |
| 2018/0197839 | A1 | 7/2018 | Yu et al. |

(Continued)

FOREIGN PATENT DOCUMENTS

JP 2009194022 A 8/2009

*Primary Examiner* — Nathan W Ha
(74) *Attorney, Agent, or Firm* — Muir Patent Law, PLLC

(57) ABSTRACT

A semiconductor package includes a semiconductor device on a first redistribution substrate and having a first sidewall, and a mold layer that covers the semiconductor device and the first redistribution substrate. The first redistribution substrate includes a first redistribution dielectric layer, a first reinforcement pattern on the first redistribution dielectric layer and overlapping the semiconductor device and the mold layer, and first and second bonding pads that penetrate the first redistribution dielectric layer and contact the first reinforcement pattern. The second bonding pad is spaced apart from the first bonding pad in a first direction. The first bonding pad has a first width in a second direction orthogonal to the first direction. When viewed in a plan view, the first reinforcement pattern has a second width in the second direction below the first sidewall. The second width is greater than the first width.

20 Claims, 12 Drawing Sheets

(56) References Cited

U.S. PATENT DOCUMENTS

| | | | |
|---|---|---|---|
| 2019/0096829 A1* | 3/2019 | Tang | H01L 21/486 |
| 2019/0355679 A1* | 11/2019 | Wu | H01Q 1/2283 |
| 2020/0020657 A1* | 1/2020 | Lai | H01L 23/3128 |
| 2020/0035625 A1* | 1/2020 | Wang | H01L 23/552 |
| 2020/0343203 A1* | 10/2020 | Wu | H01L 23/5389 |
| 2020/0365517 A1* | 11/2020 | Lin | H01L 24/14 |
| 2021/0013151 A1* | 1/2021 | Yu | H01L 24/17 |
| 2021/0074623 A1 | 3/2021 | Chun et al. | |
| 2022/0254722 A1* | 8/2022 | Yu | H01L 23/5283 |
| 2022/0336385 A1* | 10/2022 | Wang | H01L 23/3128 |
| 2022/0336386 A1* | 10/2022 | Wu | H01L 21/56 |

* cited by examiner

SEMICONDUCTOR PACKAGE INCLUDING REINFORCEMENT PATTERN

CROSS-REFERENCE TO RELATED APPLICATION

This U.S. nonprovisional application claims priority under 35 U.S.C § 119 to Korean Patent Application No. 10-2021-0076837 filed on Jun. 14, 2021 in the Korean Intellectual Property Office, the disclosure of which is hereby incorporated by reference in its entirety.

BACKGROUND

The present inventive concepts provide a semiconductor package, and more particularly, to a semiconductor package including a reinforcement pattern.

A semiconductor package is provided to implement an integrated circuit chip for electronic products. In a semiconductor package, a semiconductor die is mounted on a printed circuit board (PCB), and bonding wires or bumps electrically connect the semiconductor die to the printed circuit board. With the development of electronic industry, many studies have been conducted to improve reliability and durability of semiconductor packages.

SUMMARY

Some embodiments of the present inventive concepts provide a semiconductor package with increased reliability and durability.

The object of the present inventive concepts is not limited to the mentioned above, and other objects which have not been mentioned above will be clearly understood to those skilled in the art from the following description.

According to an embodiment of the present invention, a semiconductor package includes a first redistribution substrate, a semiconductor device disposed on the first redistribution substrate and having a first sidewall, and a mold layer that covers the semiconductor device and the first redistribution substrate. The first redistribution substrate includes a first redistribution dielectric layer, a first reinforcement pattern at the first redistribution dielectric layer, the first reinforcement pattern overlapping the semiconductor device and the mold layer, and a first bonding pad and a second bonding pad, each of the first bonding pad and the second bonding pad penetrating the first redistribution dielectric layer and contacting the first reinforcement pattern. The second bonding pad is spaced apart from the first bonding pad in a first direction. When viewed in a plan view, the first sidewall extends in a second direction between the first bonding pad and the second bonding pad. The first bonding pad has a first width in a second direction orthogonal to the first direction. When viewed in the plan view, the first reinforcement pattern overlaps the first sidewall of the semiconductor device and has a second width in the second direction, the second width being greater than the first width.

According to an embodiment of the present invention, a semiconductor package includes a first redistribution substrate, a connection substrate disposed on the first redistribution substrate and having a cavity, a semiconductor device inserted into the cavity and disposed on the first redistribution substrate, the semiconductor device having a first sidewall, a mold layer that covers the connection substrate and the semiconductor device, and a second redistribution substrate on the mold layer. The first redistribution substrate includes a plurality of first redistribution dielectric layers that are sequentially stacked on each other, a first reinforcement pattern at a lowermost first redistribution dielectric layer of the plurality of first redistribution dielectric layers, and a first bonding pad and a second bonding pad, each of the first bonding pad and the second bonding pad penetrating the lowermost first redistribution dielectric layer and contacting the first reinforcement pattern. The first reinforcement pattern overlaps the semiconductor device and the connection substrate. The first bonding pad is below the semiconductor device. The second bonding pad is below the connection substrate. The first reinforcement pattern has a width between about 250 µm and about 1,300 µm. When viewed in a plan view, the first reinforcement pattern overlaps the first sidewall.

According to an embodiment of the present invention, a semiconductor package includes a first redistribution substrate, a semiconductor device on the first redistribution substrate; and a mold layer that covers the semiconductor device and the first redistribution substrate. The first redistribution substrate includes a first redistribution dielectric layer, a first reinforcement pattern and a second reinforcement pattern that are on the first redistribution dielectric layer and are spaced apart from each other, and a signal line at the first redistribution dielectric layer and between the first reinforcement pattern and the second reinforcement pattern. Each of the first reinforcement pattern and the second reinforcement pattern overlaps the semiconductor device and the mold layer. A ground voltage is applied to the first reinforcement pattern and the second reinforcement pattern.

DETAILED DESCRIPTION OF EMBODIMENTS

Some embodiments of the present inventive concepts will now be described in detail with reference to the accompanying drawings to aid in clearly explaining the present inventive concepts.

Figure 1A:
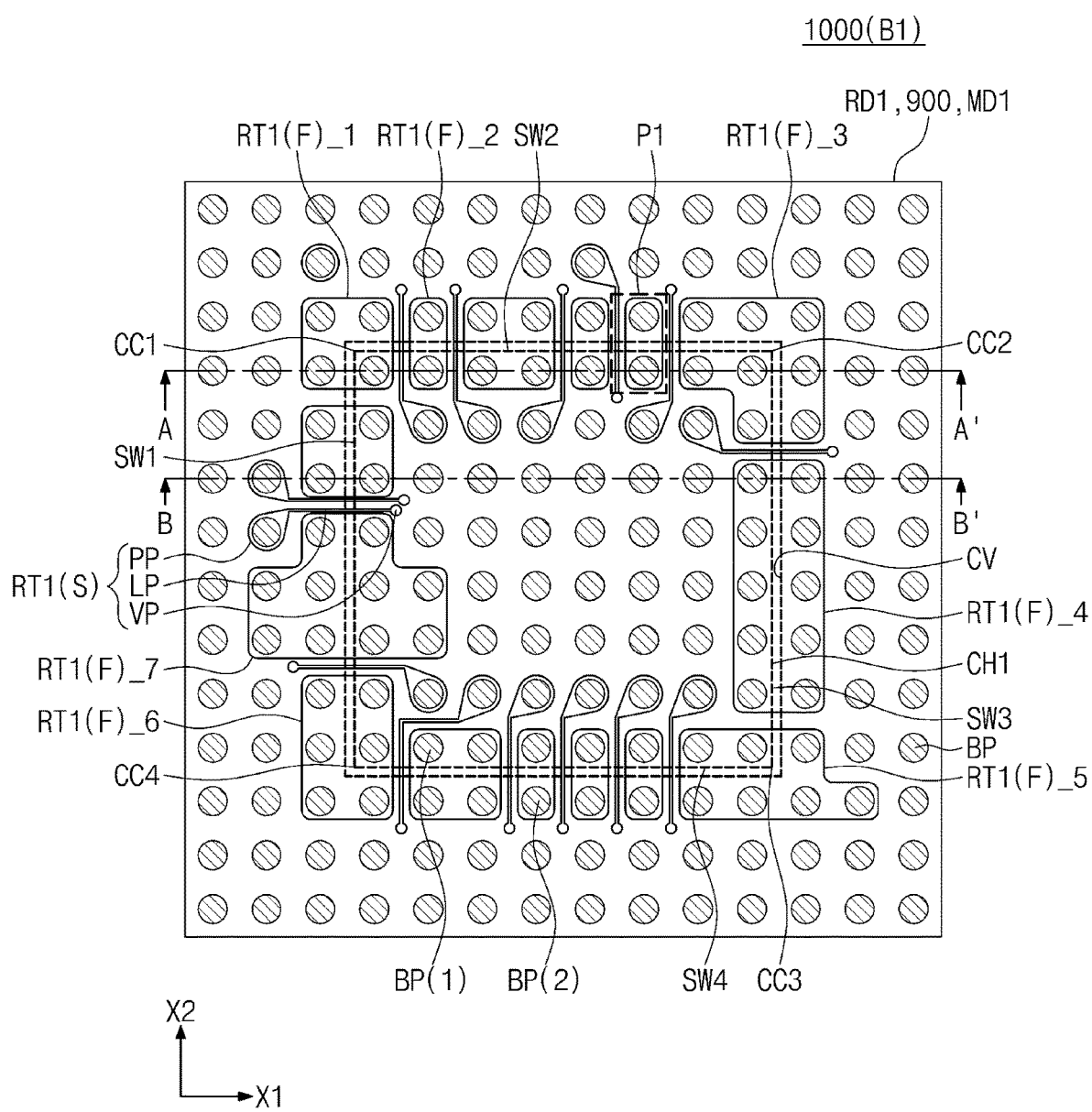
FIG. 1A illustrates a bottom view showing a semiconductor package according to some embodiments of the present inventive concepts.
Figure 1B:
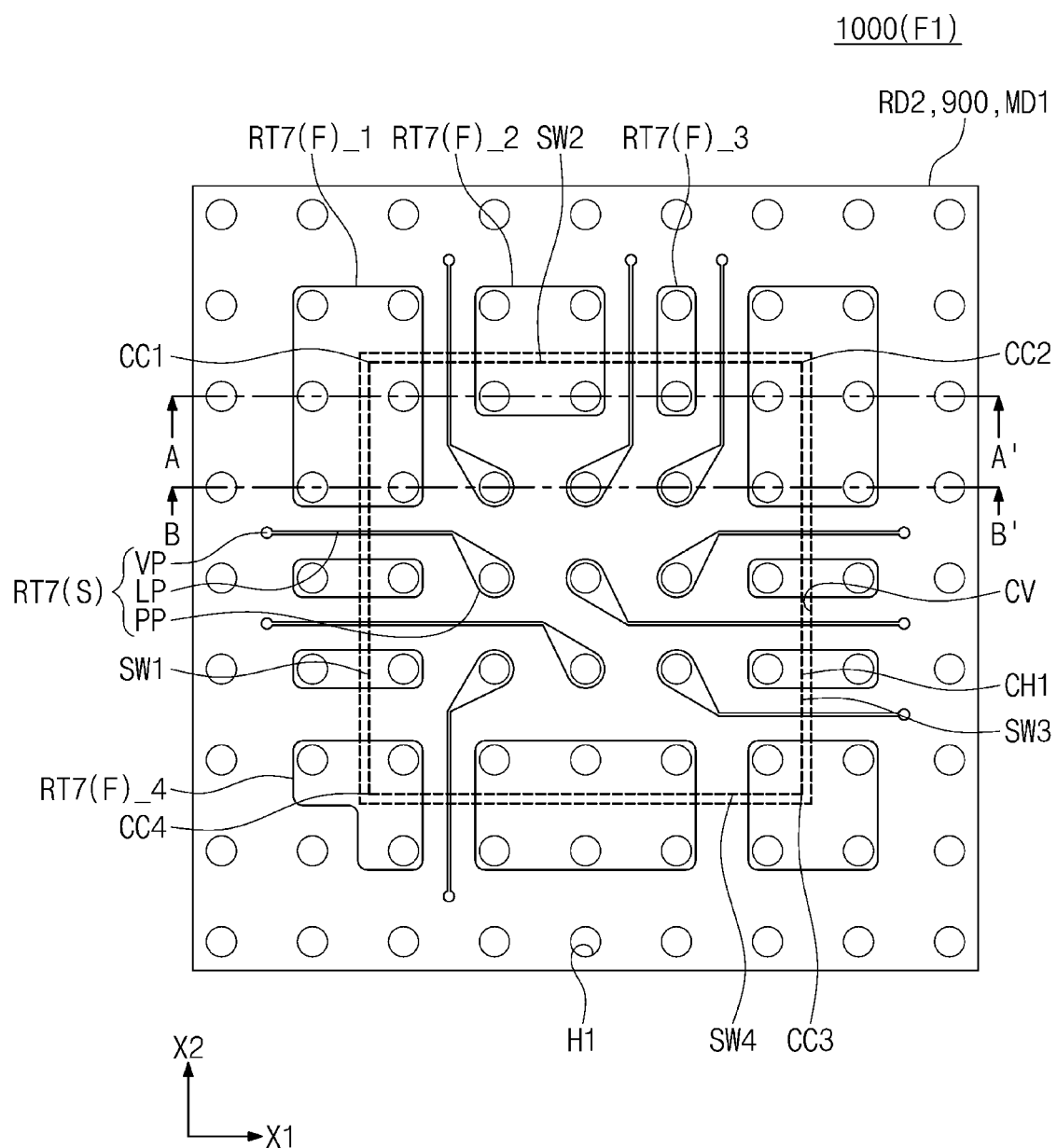
FIG. 1B illustrates a top view showing a semiconductor package according to some embodiments of the present inventive concepts.
Figure 2A:
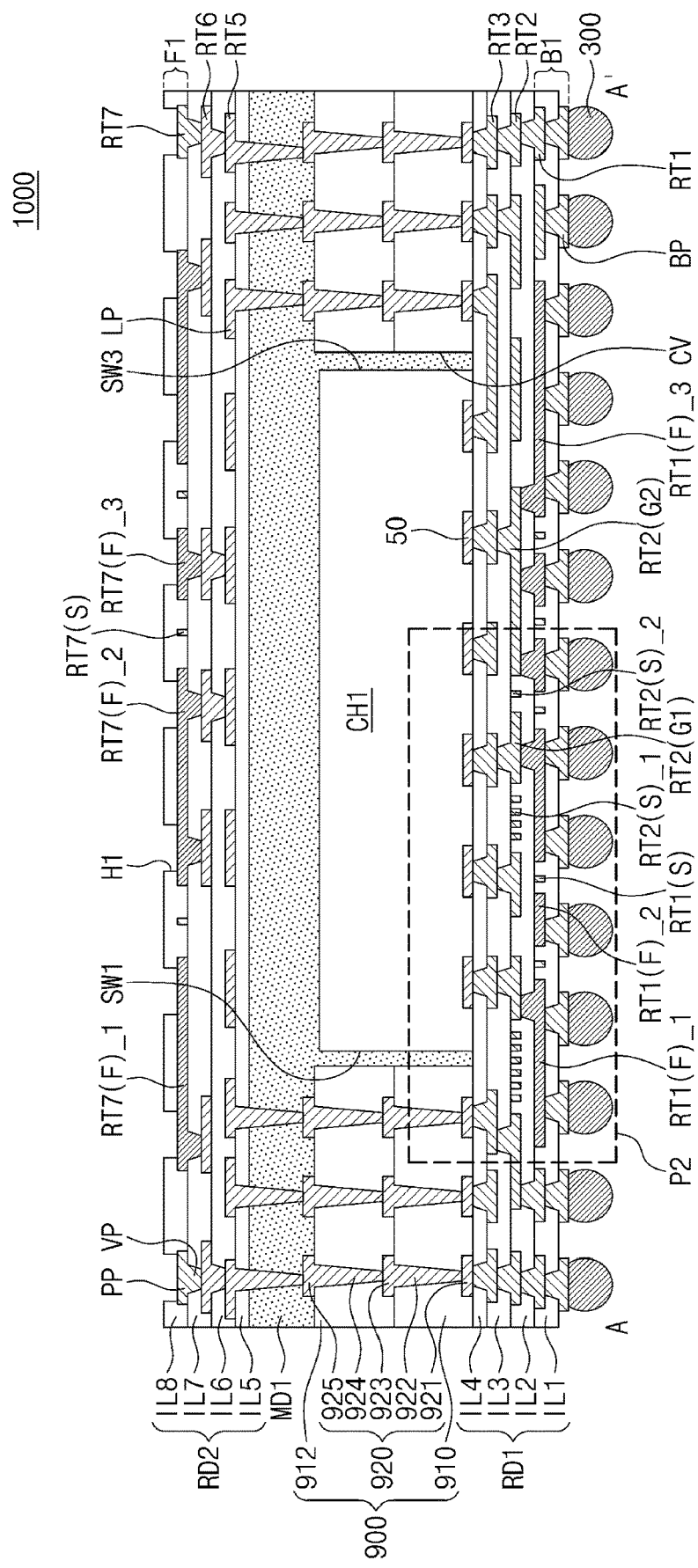
FIG. 2A illustrates a cross-sectional view taken along line A-A' of FIG. 1A or 1B.
Figure 2B:
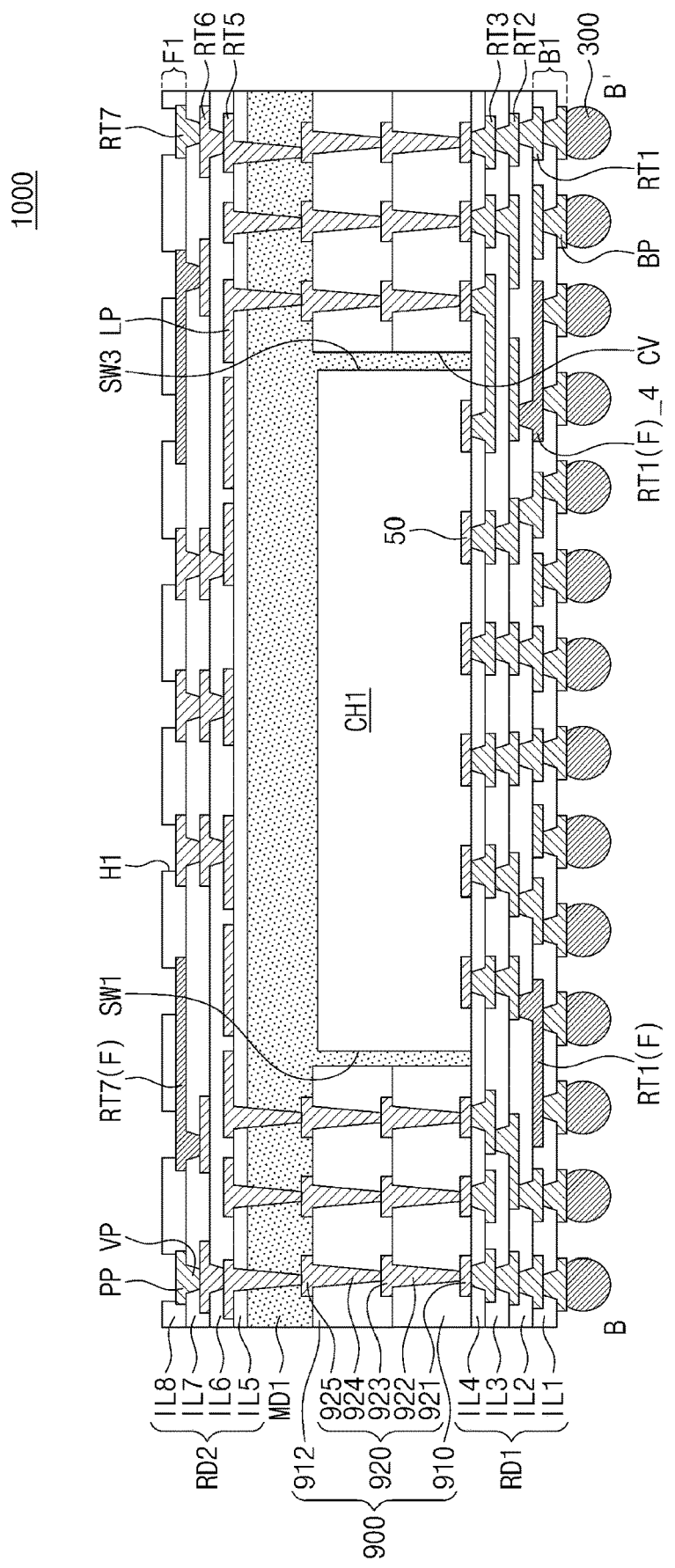
FIG. 2B illustrates a cross-sectional view taken along line B-B' of FIG. 1A or 1B.
Figure 3A:
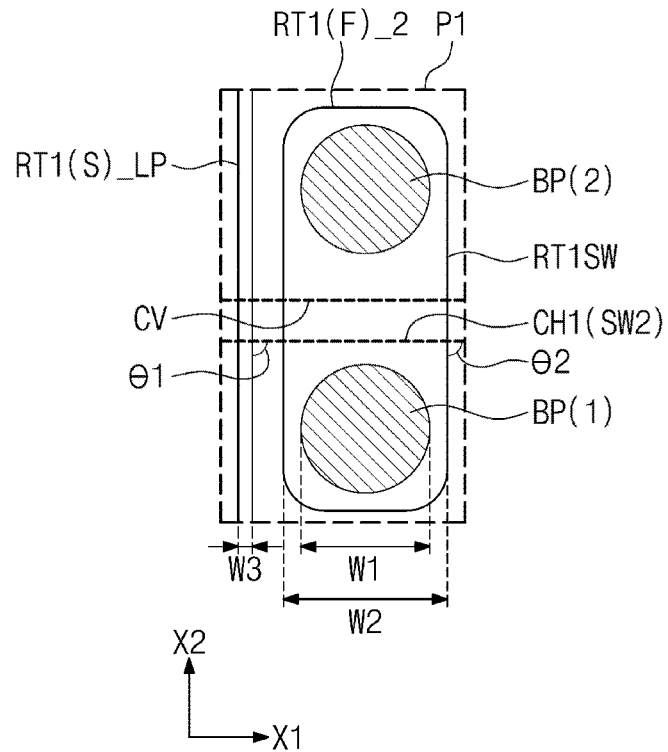
FIG. 3A illustrates an enlarged view showing section P1 of FIG. 1A.
Figure 3B:
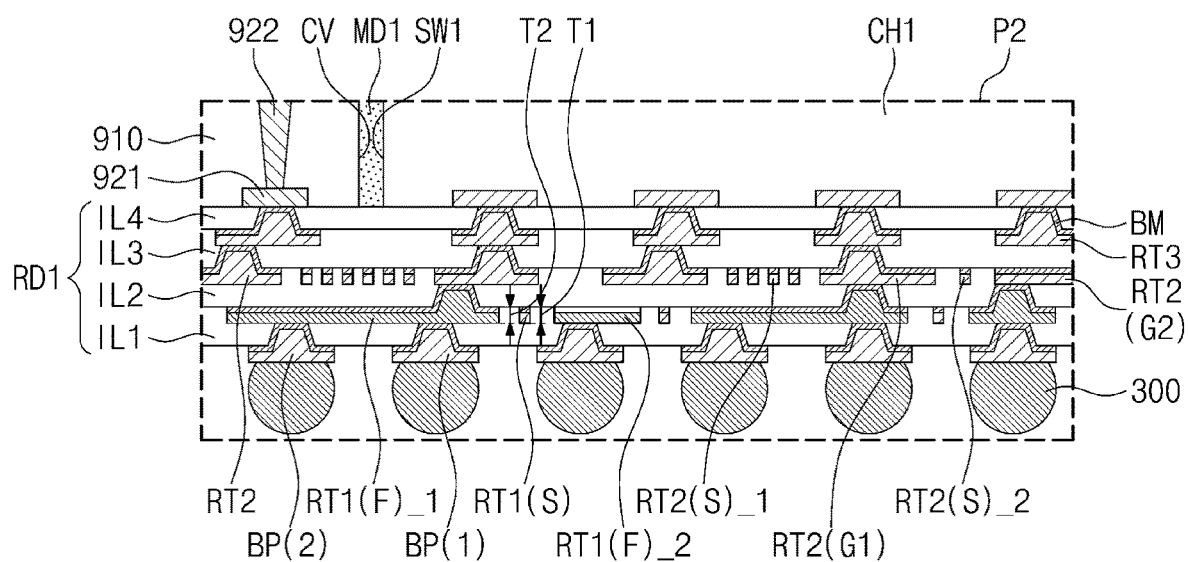
FIG. 3B illustrates an enlarged view showing section P2 of FIG. 2A.

FIG. 1A illustrates a bottom view showing a semiconductor package according to some embodiments of the present inventive concepts. FIG. 1B illustrates a top view showing a semiconductor package according to some embodiments of the present inventive concepts. FIG. 2A illustrates a cross-sectional view taken along line A-A' of FIG. 1A or 1B. FIG. 2B illustrates a cross-sectional view taken along line B-B' of FIG. 1A or 1B. FIG. 3A illustrates an enlarged view showing section P1 of FIG. 1A. FIG. 3B illustrates an enlarged view showing section P2 of FIG. 2A. FIG. 1A depicts a layout at a level of a first lower layer B1 of FIG. 2A or 2B. FIG. 1B depicts a layout at a level of a first upper layer F1 of FIG. 2A or 2B. The first lower layer B1 may indicate a lowermost layer of a first redistribution substrate RD1. The first upper layer F1 may indicate an uppermost layer of a second redistribution substrate RD2.

Referring to FIGS. 1A, 1B, 2A, 2B, 3A, and 3B, a semiconductor package 1000 according to some embodiments may be a chip-first type fan-out panel level package (FOPLP) or may be shaped like an FOPLP. The semiconductor package 1000 may include a first redistribution substrate RD1 and a first semiconductor device CH1 mounted on the first redistribution substrate RD1. The first redistribution substrate RD1 may be provided thereon with a connection substrate 900 that has a cavity CV at a center of the connection substrate 900. The first semiconductor device CH1 may be inserted into the cavity CV. The first semiconductor device CH1 and the connection substrate 900 may be covered with a first mold layer MD1. A portion of the first mold layer MD1 may be inserted into the cavity CV to fill a gap between a sidewall of the first semiconductor device CH1 and an inner sidewall of the cavity CV of the connection substrate 900. A second redistribution substrate RD2 may be disposed on the first mold layer MD1. In this description, the term "redistribution substrate" may be called "redistribution layer" or "wiring structure."

The first redistribution substrate RD1 may include first, second, third, and fourth redistribution dielectric layers IL1, IL2, IL3, and IL4 that are sequentially stacked on each other. The first, second, third, and fourth redistribution dielectric layers IL1, IL2, IL3, and IL4 may each include or may be formed of a photo-imagable dielectric (PID) layer. A first redistribution pattern RT1 may be interposed between the first redistribution dielectric layer IL1 and the second redistribution dielectric layer IL2. A second redistribution pattern RT2 may be interposed between the second redistribution dielectric layer IL2 and the third redistribution dielectric layer IL3. A third redistribution pattern RT3 may be interposed between the third redistribution dielectric layer IL3 and the fourth redistribution dielectric layer IL4.

The first redistribution dielectric layer IL1 may be provided thereunder with lower bonding pads BP that penetrate the first redistribution dielectric layer IL1 and contact the first redistribution patterns RT1. The lower bonding pads BP may be two-dimensionally arranged along a first direction X1 and a second direction X2. The lower bonding pads BP may each have a circular shape when viewed in a plan view. Although not shown, one or more of the lower bonding pads BP may have a square shape or a rhombic shape. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower bonding pads BP may be provided with external connection terminals 300 bonded thereto. The external connection terminals 300 may include one or more of solder balls, conductive bumps, and conductive pillars. The external connection terminals 300 may include or may be formed of at least one selected from tin, lead, silver, copper, aluminum, gold, and nickel.

One or more of the first to third redistribution patterns RT1 to RT3 may include a via part VP that penetrates the second, third, and fourth redistribution dielectric layers IL2, IL3, and IL4, a pad part PP, and a line part LP that connects the via part VP and the pad part PP with each other. The via part VP may have an inclined sidewall. The via part VP may have a width that decreases in an upward direction. The lower bonding pads BP and the first to third redistribution patterns RT1 to RT3 may include or may be formed of metal, such as copper, aluminum, gold, nickel, and titanium. A diffusion stop layer BM may be interposed between the lower bonding pads BP, the first to third redistribution patterns RT1 to RT3, and the first to fourth redistribution dielectric layers IL1 to IL4. In some embodiments, the first to third redistribution patterns RT1 to RT3 may each include or may be formed of a diffusion stop layer BM. The diffusion stop layer BM may include or may be formed of, for example, titanium, tantalum, titanium nitride, tantalum, or tungsten nitride.

The first semiconductor device CH1 may be a single semiconductor die, a single semiconductor chip, or a semiconductor package that includes a plurality of semiconductor dies of the same type or different types. The first semiconductor device CH1 may be one selected from an image sensor chip such as a complementary metal oxide semiconductor (CMOS) image sensor (CIS), a microelectromechanical system (MEMS) device chip, an application specific integrated circuit (ASIC) chip, and a memory device chip such as a flash memory, a dynamic random access memory (DRAM), a static random access memory (SRAM), an electrically erasable programmable read-only memory (EEPROM), a phase change random access memory (PRAM), a magneto-resistive random access memory (MRAM), a resistive random access memory (ReRAM), a high bandwidth memory (HBM), and a hybrid memory cubic (HMC).

The first semiconductor device CH1 may include chip pads 50. One or more of the third redistribution patterns RT3 may be in contact with the chip pads 50. The first semiconductor device CH1 may have a bottom surface in contact with the first redistribution substrate RD1. When viewed in a plan view as shown in FIG. 1A or 1B, the first semiconductor device CH1 may have first to fourth sidewalls SW1 to SW4 arranged in a clockwise direction.

The connection substrate 900 may include a plurality of base layers 910 and 912 and a conductive structure 920. The base layers 910 and 912 may include, for example, a first base layer 910 and a second base layer 912 that constitute a bi-layered structure. The base layers 910 and 912 may include three or more stacked base layers. The base layers 910 and 912 may include or may be formed of a dielectric material. For example, the base layers 910 and 912 may include or may be formed of a carbon-based material, a ceramic, or a polymer.

The conductive structure 920 may include a connection pad 921, a first connection via 922, a first connection line 923, a second connection via 924, and a second connection line 925. In some embodiments, the first connection via 922 and the first connection line 923 may constitute a single unitary piece. The second connection via 924 and the second connection line 925 may constitute a single unitary piece. The conductive structure 920 may include or may be formed of metal, such as copper, aluminum, gold, nickel, and titanium.

The first mold layer MD1 may cover a sidewall and a top surface of the first semiconductor device CH1, a top surface and an inner lateral surface of the connection substrate 900, and a top surface of the first redistribution substrate RD1. The first mold layer MD1 may include or may be formed of a dielectric resin, such as an epoxy molding compound (EMC). The first mold layer MD1 may further include fillers, and the fillers may be dispersed in the dielectric resin. The first mold layer MD1 may fill a space between the first semiconductor device CH1 and the connection substrate 900.

The second redistribution substrate RD2 may include fifth, sixth, seventh, and eighth redistribution dielectric layers IL5, IL6, IL7, and IL8 that are sequentially stacked on each other. The fifth, sixth, seventh, and eighth redistribution dielectric layers IL5, IL6, IL7, and IL8 may each include or may be formed of a photo-imagable dielectric (PID) layer. A fifth redistribution pattern RT5 may be interposed between the fifth redistribution dielectric layer IL5 and the sixth redistribution dielectric layer IL6. A sixth redistribution pattern RT6 may be interposed between the sixth redistribution dielectric layer IL6 and the seventh redistribution dielectric layer IL7. A seventh redistribution pattern RT7 may be interposed between the seventh redistribution dielectric layer IL7 and the eighth redistribution dielectric layer IL8. Similar to the first to third redistribution patterns RT1 to RT3, one or more of the fifth to seventh redistribution patterns RT5 to RT7 may include a via part VP, a pad part PP, and a line part LP. The eighth redistribution dielectric layer IL8 may include a plurality of upper pad holes H1 that expose the pad parts PP of the seventh redistribution patterns RT7. A diffusion stop layer BM may be interposed between the fifth to seventh redistribution patterns RT5 to RT7 and the fifth to seventh redistribution dielectric layers IL5 to IL7. The via part VP of the fifth redistribution pattern RT5 may penetrate the fifth redistribution dielectric layer IL5 and the first mold layer MD1, thereby being connected to the second connection line 925. The upper pad holes H1 may be two-dimensionally arranged along the first direction X1 and the second direction X2. The number of the upper pad holes H1 may be different from the number of the lower bonding pads BP. In some embodiments, the number of the upper pad holes H1 may be smaller than the number of the lower bonding pads BP. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIGS. 1A, 2A, and 2B, the first redistribution substrate RD1 may be configured such that the first redistribution patterns RT1 include first-level (or lowermost) lower reinforcement patterns RT1(F) and first-level (or lowermost) lower signal lines RT1(S). As discussed above, the first-level lower signal lines RT1(S) may each include a via part VP, a pad part PP, and a line part LP. When viewed in a plan view, the line parts LP of the first-level lower signal lines RT1(S) may cross over the sidewalls SW1 to SW4 of the first semiconductor device CH1. The line parts LP of the first-level lower signal lines RT1(S) may be orthogonal to the sidewalls SW1 to SW4 of the first semiconductor device CH1.

For example, when viewed in a plan view as shown in FIG. 3A, the line part LP of one of the first-level lower signal lines RT1(S) may make a first angle θ1 with the second sidewall SW2 of the first semiconductor device CH1. The first angle θ1 may range, for example, from about 85° to about 95°. Therefore, it may be possible to minimize or prevent cracks caused by difference in physical properties between the first semiconductor device CH1 and the first mold layer MD1. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first-level lower reinforcement patterns RT1(F) may overlap the sidewalls SW1 to SW4 and corners CC1 to CC4 of the first semiconductor device CH1. Each of the first-level lower reinforcement patterns RT1(F) may overlap both the first semiconductor device CH1 and the first mold layer MD1. In addition, the first-level lower reinforcement patterns RT1(F) may each overlap the connection substrate 900. When viewed in a plan view, some of sidewalls of the first-level lower reinforcement patterns RT1(F) may be orthogonal to the sidewalls SW1 to SW4 of the first semiconductor device CH1.

For example, when viewed in a plan view as shown in FIG. 3A, a second one RT1(F)_2 of the first-level lower reinforcement patterns RT1(F) may have a sidewall RT1SW that makes a second angle θ2 with the second sidewall SW2 of the first semiconductor device CH1. The second angle θ2 may range, for example, from about 85° to about 95°. Therefore, it may be possible to minimize or prevent cracks caused by difference in physical properties between the first semiconductor device CH1 and the first mold layer MD1.

Each of the first-level lower reinforcement patterns RT1(F) may have an area greater than that of each of the first-level lower signal lines RT1(S).

Each of the first-level lower reinforcement patterns RT1(F) may overlap at least two lower bonding pads BP. Each of the first-level lower reinforcement patterns RT1(F) may overlap at least two external connection terminals 300. Each of the first-level lower reinforcement patterns RT1(F) may overlap at least one first lower bonding pad BP(1) and at least one second lower bonding pad BP(2). The lower bonding pads BP may include first lower bonding pads BP(1) that overlap the first semiconductor device CH1 and second lower bonding pads BP(2) that overlap the connection substrate 900.

The first-level lower reinforcement patterns RT1(F) may prevent cracks from occurring between the first semiconductor device CH1 and the first mold layer MD1 or between the first semiconductor device CH1 and the connection substrate 900. The first-level lower reinforcement patterns RT1(F) may support regions between an inner sidewall of the cavity CV of the connection substrate 900 and the sidewalls SW1 to SW4 of the CH1 to prevent cracks from occurring at the regions. Accordingly, the semiconductor package 1000 may increase in reliability and durability.

In some embodiments, referring to FIG. 1A, the first-level lower reinforcement patterns RT1(F) may include first to seventh first-level lower reinforcement patterns RT1(F)_1 to RT1(F)_7 whose shapes are different from each other. For example, the first first-level lower reinforcement patterns RT1(F)_1 may overlap four lower bonding pads BP and may have a substantially square shape when viewed in a plan view. The second first-level lower reinforcement patterns RT1(F)_2 may overlap two lower bonding pads BP and may have a substantially rectangular shape when viewed in a plan view. The third first-level lower reinforcement patterns RT1(F)_3 may overlap eight lower bonding pads BP and may have an L-shape when viewed in a plan view. The fourth first-level lower reinforcement patterns RT1(F)_4 may overlap eight lower bonding pads BP and may have a rectangular shape when viewed in a plan view. The fifth first-level lower reinforcement patterns RT1(F)_5 may overlap seven lower bonding pads BP and may have an L shape when viewed in a plan view. The sixth first-level lower reinforcement patterns RT1(F)_6 may overlap six lower bonding pads BP and may have a rectangular shape when viewed in a plan view. The seventh first-level lower reinforcement patterns RT1(F)_7 may overlap ten lower bonding pads BP and may have a T shape when viewed in a plan view. The term "substantially" may be used herein to emphasize this meaning, unless the context or other statements indicate otherwise. For example, items described as "substantially the same," "substantially equal," "substantially planar," or "substantially square" may be exactly the same, equal, planar, or square, or may be the same, equal, planar, or square within acceptable variations that may occur, for example, due to manufacturing processes. The term "substantially square shape" may also include a square shape with rounded corners. This applies to "substantially rectangular shape".

The shapes and arrangement of the first-level lower reinforcement patterns RT1(F) may be variously changed without being limited to those shown in FIG. 1A. For example, one kind (e.g., the second first-level lower reinforcement patterns RT1(F)_2) selected from the first to seventh first-level lower reinforcement patterns RT1(F)_1 to RT1(F)_7 may be provided in plural in the first redistribution substrate RD1, and the plurality of kinds selected from the first to seventh first-level lower reinforcement patterns RT1(F)_1 to RT1(F)_7 may be disposed to overlap the sidewalls SW1 to SW4 of the first semiconductor device CH1. In some embodiments, two kinds (e.g., the first first-level lower reinforcement patterns RT1(F)_1 and the second first-level lower reinforcement patterns RT(F)_2) selected from the first to seventh first-level lower reinforcement patterns RT1(F)_1 to RT1(F)_7 may be provided in plural in the first redistribution substrate RD1, and the plurality of two kinds selected from the first to seventh first-level lower reinforcement patterns RT1(F)_1 to RT1(F)_7 may be disposed to overlap the sidewalls SW1 to SW4 of the first semiconductor device CH1. In some embodiments, three or more kinds may be selected from the first to seventh first-level lower reinforcement patterns RT1(F)_1 to RT1(F)_7.

Referring to FIG. 3A, the second first-level lower reinforcement pattern RT1(F)_2 may have a size less than that of any other of the first-level lower reinforcement patterns RT1(F)_1. Each of the lower bonding pads BP may have, for example, a first width W1 in the first direction X1. The second first-level lower reinforcement pattern RT1(F)_2 may have a second width W2 in the first direction X1. The second width W2 of the second first-level lower reinforcement pattern RT1(F)_2 may be constant along the second direction X2. In some embodiments, at opposite end portions of the second first-level lower reinforcement pattern RT1(F)_2 may have rounded corners and may have widths less than the second width W2. On the second sidewall SW2 of the first semiconductor device CH1, the second width W2 of the second first-level lower reinforcement pattern RT1(F)_2 may also have the second width W2 in the first direction X1. The second width W2 may be equal to or greater than the first width W1. The line part LP of the first-level lower signal line RT1(S) may have a third width W3. The third width W3 may be less than the first width W1 and the second width W2. The second width W2 may range, for example, from about 250 μm to about 1,300 μm. The third width W3 may be about ⅟25 to about ⅟200 of the second width W2. For example, the third width W3 may range from about 4 μm to about 10 μm. The first-level lower reinforcement patterns RT1(F) except for the second first-level lower reinforcement pattern RT1(F)_2 may have their widths each of which is equal to or greater than the second width W2, for example, a positive integer multiple of the second width W2.

On the sidewalls SW1 to SW4 of the first semiconductor device CH1, the first-level lower reinforcement patterns RT1(F) may each have a width (e.g., W2) greater than the first width W1 of the lower bonding pad BP and may have several tens to hundreds of times a width of the line part LP of the first-level lower signal line RT1(S), with the result that it may be remarkably effective to prevent the semiconductor package 1000 from being cracked at locations adjacent to the sidewalls SW1 to SW4 of the first semiconductor device CH1.

The first-level lower reinforcement patterns RT1(F) that overlap the corners CC1 to CC4 may each have an area greater than that of the second first-level lower reinforcement pattern RT1(F)_2. Therefore, it may be possible to effectively prevent the occurrence of crack at locations adjacent to the corners CC1 to CC4 that are most vulnerable to physical/thermal stress.

When the first-level lower reinforcement patterns RT1(F) are present on an outermost edge of the semiconductor package 1000, an excellent reinforcement effect may be achieved. For example, the first-level lower reinforcement patterns RT1(F) may be positioned on the first lower layer B1 located at the same level as that of the first redistribution patterns RT1, or lowermost ones of the first to third redistribution patterns RT1 to RT3.

Referring to FIG. 3B, the first-level lower signal line RT1(S) including the diffusion stop layer BM may have a first thickness T1. The first-level lower reinforcement pattern RT1(F) including the diffusion stop layer BM may have a second thickness T2. A plating process may be employed to form the first-level lower reinforcement pattern RT1(F) and the first-level lower signal line RT1(S). The second thickness T2 may be the same as the first thickness T1. In some embodiments, because the first-level lower reinforcement pattern RT1(F) has an area greater than that of the first-level lower signal line RT1(S), a loading effect in a fabrication process of forming the first-level lower reinforcement pattern RT1(F) and the first-level lower signal line RT1(S) may cause the second thickness T2 to be greater than the first thickness T1. In some embodiments, in order for an increase in reinforcement, the first-level lower reinforcement pattern RT1(F) and the first-level lower signal line RT1(S) may be formed such that the second thickness T2 is greater than the first thickness T1. The first thickness T1 may indicate a first distance between a bottom surface of the second redistribution dielectric layer IL2 and a bottom surface of the first-level lower signal line RT1(S). The second thickness T2 may indicate a second distance between a bottom surface of the second redistribution dielectric layer IL2 and a bottom surface of the first-level lower reinforcement pattern RT1(F).

The first-level lower reinforcement pattern RT1(F) may include or may be formed of the same material as that of the first-level lower signal line RT1(S). In this case, the first-level lower reinforcement pattern RT1(F) and the first-level lower signal line RT1(S) may be formed simultaneously with each other, and thus the fabrication process may be simplified.

In some embodiments, the first-level lower reinforcement pattern RT1(F) may be formed of a material different from that of the first-level lower signal line RT1(S). For example, in order for an increase in reinforcement, a material included in the first-level lower reinforcement pattern RT1(F) may have rigidity greater than that of a material included in the first-level lower signal line RT1(S). For example, the first-level lower reinforcement pattern RT1(F) may include or may be formed of tungsten or titanium. The first-level lower signal line RT1(S) may include or may be formed of a material whose electrical resistance is less than that of a material included in the first-level lower reinforcement pattern RT1(F). For example, the first-level lower signal line RT1(S) may include or may be formed of copper.

In some embodiments, even when the first-level lower reinforcement pattern RT1(F) and the first-level lower signal line RT1(S) include or may be formed of the same material, the first-level lower reinforcement pattern RT1(F) may have a density greater than that of the first-level lower signal line RT1(S), and as a result the first-level lower reinforcement pattern RT1(F) may have rigidity greater than that of the first-level lower signal line RT1(S).

At least one of the first-level lower reinforcement patterns RT1(F) may be provided with (i.e., supplied with) a ground voltage or power voltage. The first-level lower signal lines RT1(S) may be provided with electrical signals such as data, command, and access. The lower bonding pad BP in contact with one of the first-level lower reinforcement patterns RT1(F) may be provided with the same ground or power voltage applied to the one of the first-level lower reinforcement patterns RT1(F). In addition, either the second redistribution pattern RT2 or the third redistribution pattern RT3 connected to the one of the first-level lower reinforcement patterns RT1(F) may be provided with the same ground or power voltage applied to the one of the first-level lower reinforcement patterns RT1(F). For example, a ground voltage may be applied to the first-level lower reinforcement patterns RT1(F) disposed on opposite sides of the first-level lower signal line RT1(S). Therefore, the first-level lower reinforcement patterns RT1(F) may serve as an electromagnetic shielding to prevent noise occurrence or speed reduction in signal transfer through the first-level lower signal line RT1(S).

Referring to FIG. 3B, the second redistribution pattern RT2 may include a plurality of second-level lower signal lines RT2(S) and a plurality of second-level ground lines RT2(G1) and RT2(G2). When viewed in a plan view, the second-level lower signal lines RT2(S) may have identical or similar shape to that of first-level lower signal lines RT1(S) depicted in FIG. 1A. The second-level lower signal lines RT2(S) may include first second-level lower signal lines RT2(S)_1 and a second second-level lower signal line RT2(S)_2. For example, the second second-level lower signal line RT2(S)_2 may be a high-speed signal line, and the first second-level lower signal lines RT2(S)_1 may be relatively low-speed signal lines. The second second-level lower signal line RT2(S)_2 may be disposed between the first second-level ground line RT2(G1) and the second second-level ground line RT2(G2). The second-level ground lines RT2(G1) and RT2(G2) may serve as an electrical shielding of the second second-level lower signal line RT2(S)_2, and thus the occurrence of noise and speed reduction may be prevented in signal transfer through the second second-level lower signal line RT2(S)_2. As a result, a semiconductor package may increase in reliability.

Referring to FIGS. 1B and 2A, the second redistribution substrate RD2 may be configured such that the seventh redistribution patterns RT7 include first-level (or uppermost) upper reinforcement patterns RT7(F) and first-level (or uppermost) upper signal lines RT7(S).

As discussed above, the first-level upper signal lines RT7(S) may each include a via part VP, a pad part PP, and a line part LP. When viewed in a plan view, the line parts LP of the first-level upper signal lines RT7(S) may cross over the first to fourth sidewalls SW1 to SW4 of the first semiconductor device CH1. The line parts LP of the first-level upper signal lines RT7(S) may be orthogonal to the first to fourth sidewalls SW1 to SW4 of the first semiconductor device CH1. Therefore, it may be possible to minimize or prevent cracks caused by difference in physical properties between the first semiconductor device CH1 and the first mold layer MD1.

The first-level upper reinforcement patterns RT7(F) may overlap the sidewalls SW1 to SW4 and the corners CC1 to CC4 of the first semiconductor device CH1. Each of the first-level upper reinforcement patterns RT7(F) may overlap the first semiconductor device CH1 and the first mold layer MD1. In addition, the first-level upper reinforcement patterns RT7(F) may each overlap the connection substrate 900. When viewed in a plan view, some of sidewalls of the first-level upper reinforcement patterns RT7(F) may be orthogonal to the sidewalls SW1 to SW4 of the first semiconductor device CH1. Each of the first-level upper reinforcement patterns RT7(F) may have an area greater than that of each of the first-level upper signal lines RT7(S). Each of the first-level upper reinforcement patterns RT7(F) may overlap at least two upper pad holes H1.

The first-level upper reinforcement patterns RT7(F) may prevent cracks from occurring between the first semiconductor device CH1 and the first mold layer MD1 or between the first semiconductor device CH1 and the connection substrate 900.

In some embodiments, referring to FIG. 1B, the first-level upper reinforcement patterns RT7(F) may include first to fourth first-level upper reinforcement patterns RT7(F)_1 to RT7(F)_4 whose shapes are different from each other. For example, the first first-level upper reinforcement patterns RT7(F)_1 may overlap six upper pad holes H1 and may have a substantially rectangular shape when viewed in a plan view. The second first-level upper reinforcement patterns RT7(F)_2 may overlap four upper pad holes H1 and may have a substantially square shape when viewed in a plan view. The third first-level upper reinforcement patterns RT7(F)_3 may overlap two upper pad holes H1 and may have a substantially rectangular shape when viewed in a plan view. The fourth first-level upper reinforcement patterns RT7(F)_4 may overlap three upper pad holes H1 and may have an L shape when viewed in a plan view. Similar to the first-level lower reinforcement patterns RT1(F), the shapes and arrangement of the first-level upper reinforcement patterns RT7(F) may be variously changed without being limited to those shown in FIG. 1B.

The first-level upper reinforcement patterns RT7(F) may each have a width which is the same as or greater than the second width W2 of each of the first-level lower reinforcement patterns RT1(F) shown in FIG. 3A. The width of each of the first-level upper reinforcement patterns RT7(F) may be about a positive integer times of the second width W2.

The first-level upper reinforcement patterns RT7(F) that overlap the corners CC1 to CC4 may each have an area greater than that of the third first-level upper reinforcement pattern RT7(F)_3. Therefore, it may be possible to effectively prevent the occurrence of crack at locations adjacent to the corners CC1 to CC4 that are most vulnerable to physical/thermal stress.

When the first-level upper reinforcement patterns RT7(F) are positioned on an outermost edge of the semiconductor package 1000, an excellent reinforcement effect may be achieved. In some embodiments, the first-level upper reinforcement patterns RT7(F) may be positioned at the first upper layer F1 which is located at the same level as that of the seventh redistribution patterns RT7, or located at the same level as that of uppermost ones among the fifth to seventh redistribution patterns RT5 to RT7.

The first-level upper reinforcement patterns RT7(F) may have the same material and thickness as those of the first-level lower reinforcement patterns RT1(F). Similar to the first-level lower reinforcement patterns RT1(F), the first-level upper reinforcement patterns RT7(F) may be provided with a ground or a power voltage. The first-level upper reinforcement patterns RT7(F) may be disposed on opposite sides of the first-level upper signal line RT7(S), and a ground voltage may be applied to the first-level upper reinforcement patterns RT7(F), with the result that the first-level upper reinforcement patterns RT7(F) may serve as an electromagnetic shielding of the first-level upper signal line RT7(S).

Figure 4:
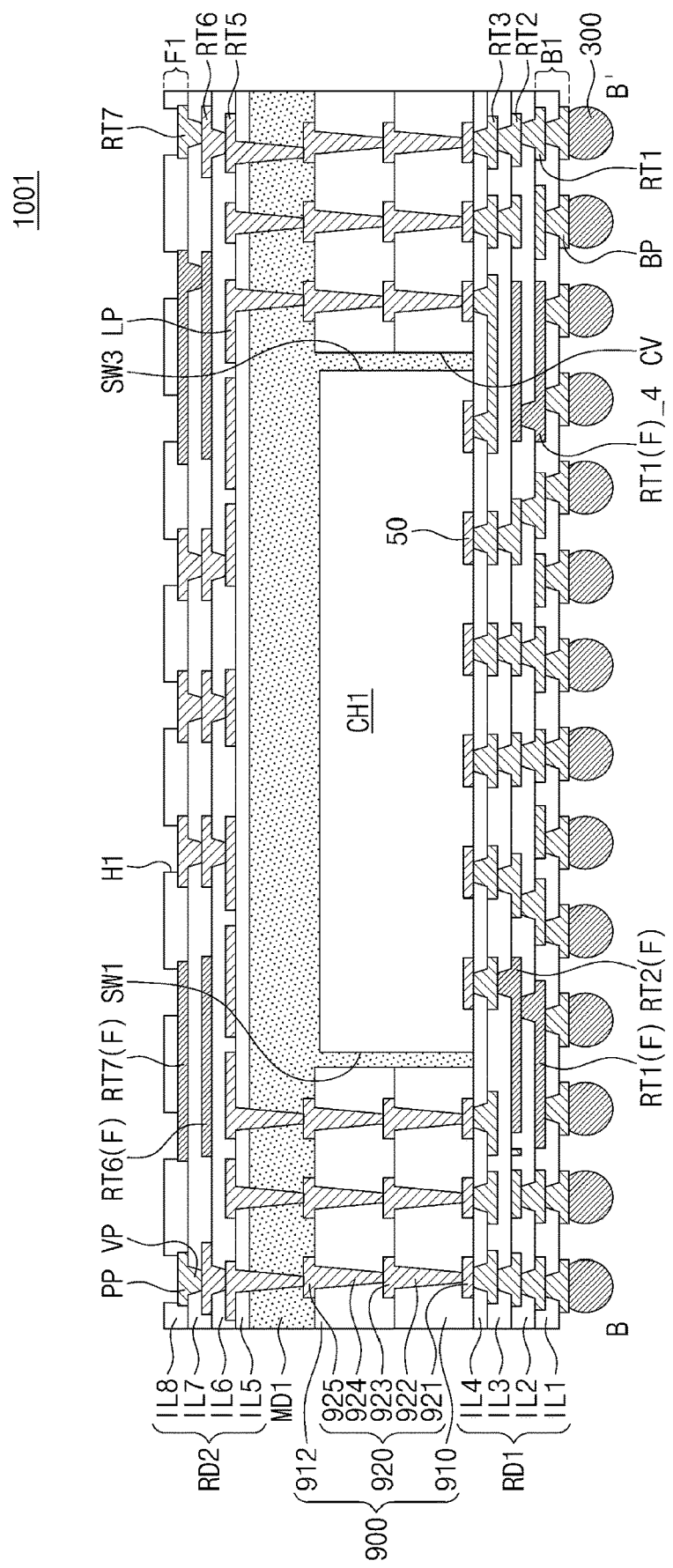
FIG. 4 illustrates a cross-sectional view taken along line B-B' of FIG. 1A or 1B.

FIG. 4 illustrates a cross-sectional view taken along line B-B' of FIG. 1A or FIG. 1B.

Referring to FIG. 4, a semiconductor package 1001 according to the present embodiment may be configured such that the second redistribution patterns RT2 further include second-level lower reinforcement patterns RT2(F). The second-level lower reinforcement patterns RT2(F) may be the same as or similar to the first-level lower reinforcement patterns RT1(F) of FIG. 1A in terms of planar shape, position, thickness, material, and so force. The second-level lower reinforcement patterns RT2(F) may overlap the first to fourth sidewalls SW1 to SW4 of the first semiconductor device CH1. The second-level lower reinforcement patterns RT2(F) may overlap the first-level lower reinforcement patterns RT1(F). In addition, the sixth redistribution patterns RT6 may further include second-level upper reinforcement patterns RT6(F). The second-level upper reinforcement patterns RT6(F) may be the same as or similar to the first-level upper reinforcement patterns RT7(F) of FIG. 1B in terms of planar shape, position, thickness, material, and so force. The second-level upper reinforcement patterns RT6(F) may overlap the first-level upper reinforcement patterns RT7(F). Other configurations may be identical or similar to those discussed with reference to FIGS. 1A to 3B.

Figure 5:
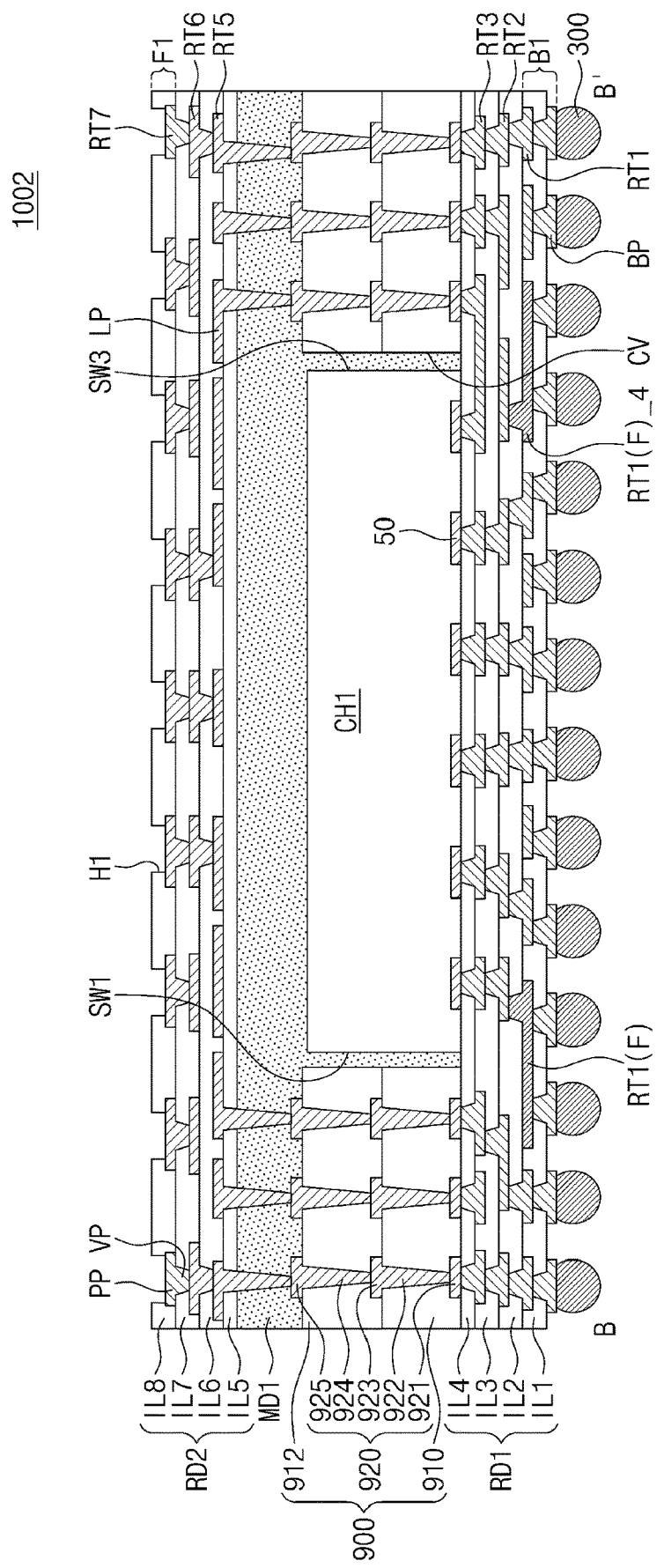
FIG. 5 illustrates a cross-sectional view taken along line B-B' of FIG. 1A or 1B.

FIG. 5 illustrates a cross-sectional view taken along line B-B' of FIG. 1A or FIG. 1B.

Referring to FIG. 5, a semiconductor package 1002 according to the present embodiment may be configured such that the second redistribution substrate RD2 does not include the first-level upper reinforcement patterns RT7(F) of FIG. 2A. The semiconductor package 1002 may include only the first-level lower reinforcement patterns RT1(F). Other configurations may be identical or similar to those discussed with reference to FIGS. 1A to 3B.

Figure 6:
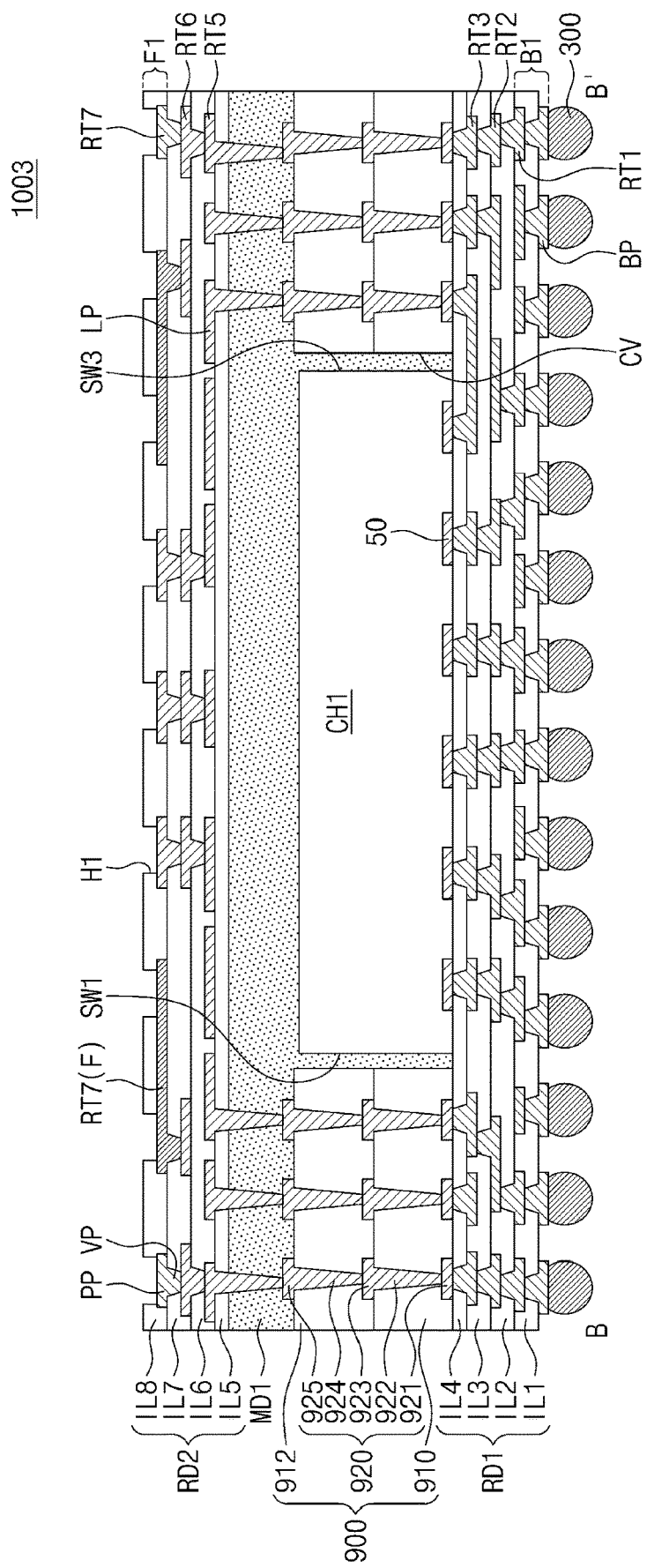
FIG. 6 illustrates a cross-sectional view taken along line B-B' of FIG. 1A or 1B.

FIG. 6 illustrates a cross-sectional view taken along line B-B' of FIG. 1A or 1B.

Referring to FIG. 6, a semiconductor package 1003 according to the present embodiment may be configured such that the second redistribution substrate RD2 does not include the first-level upper reinforcement patterns RT7(F) of FIG. 2A. The semiconductor package 1003 may include only the first-level upper reinforcement patterns RT7(F). Other configurations may be identical or similar to those discussed with reference to FIGS. 1A to 3B.

Figure 7:
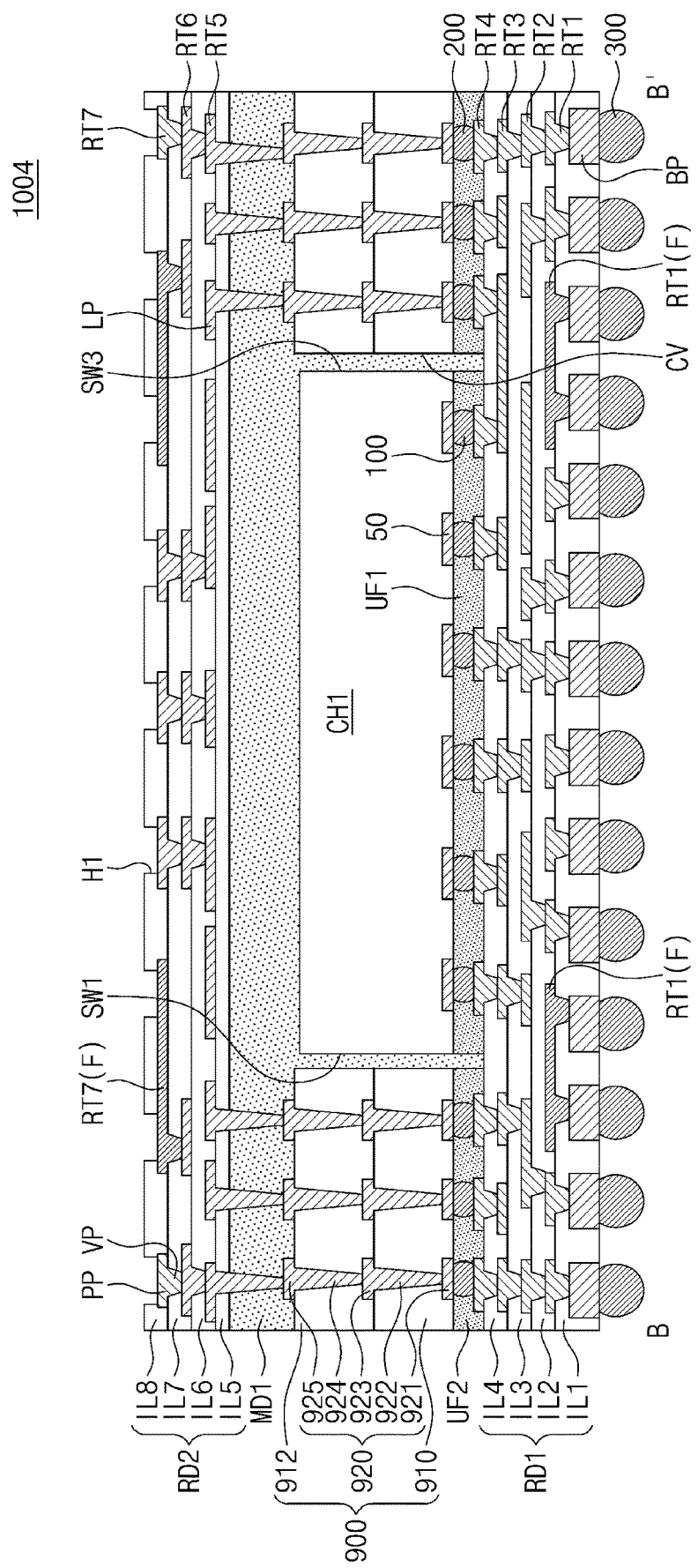
FIG. 7 illustrates a cross-sectional view taken along line B-B' of FIG. 1A or 1B.

FIG. 7 illustrates a cross-sectional view taken along line B-B' of FIG. 1A or 1B.

Referring to FIG. 7, a semiconductor package 1004 according to the present embodiment may be an FOPLP or may be shaped like an FOPLP. The semiconductor package 1004 may be configured such that the first redistribution substrate RD1 includes the lower bonding pads BP disposed in the first redistribution dielectric layer IL1. The first redistribution patterns RT1 may be disposed between the first redistribution dielectric layer IL1 and the second redistribution dielectric layer IL2, and the via parts VP of the first redistribution patterns RT1 may penetrate the first redistribution dielectric layer IL1 to contact the lower bonding pads BP. The second redistribution patterns RT2 may be disposed between the second redistribution dielectric layer IL2 and the third redistribution dielectric layer IL3, and the via parts VP of the second redistribution patterns RT2 may penetrate the second redistribution dielectric layer IL2 to contact the first redistribution patterns RT1.

The third redistribution patterns RT3 may be disposed between the third redistribution dielectric layer IL3 and the fourth redistribution dielectric layer IL4, and the via parts VP of the third redistribution patterns RT3 may penetrate the third redistribution dielectric layer IL3 to contact the second redistribution patterns RT2. The fourth redistribution patterns RT4 may be disposed on the fourth redistribution dielectric layer IL4, and the via parts VP of the fourth redistribution patterns RT4 may penetrate the fourth redistribution dielectric layer IL4 to contact the third redistribution patterns RT3. The via parts VP of the first to fourth redistribution patterns RT1 to RT4 may each have a width that decreases in a downward direction.

The chip pads 50 of the first semiconductor device CH1 may be connected through first inner connection terminals 100 to some of the fourth redistribution patterns RT4. Connection pads 921 of the connection substrate 900 may be connected through second inner connection terminals 200 to others of the fourth redistribution patterns RT4. The first and second inner connection terminals 100 and 200 may include at least one selected from solder balls, conductive bumps, and conductive pillars. The first and second inner connection terminals 100 and 200 may include or may be formed of at least one selected from copper, tin, lead, silver, aluminum, gold, and nickel.

The first semiconductor device CH1 may be spaced apart from the first redistribution substrate RD1, and a first under-fill layer UF1 may be interposed therebetween. The connection substrate 900 may be spaced apart from the first redistribution substrate RD1, and a second under-fill layer UF2 may be interposed therebetween. The first and second under-fill layers UF1 and UF2 may include or may be formed of an epoxy resin. The first and second under-fill layers UF1 and UF2 may further include inorganic or organic fillers. Other configurations may be identical or similar to those discussed with reference to FIGS. 1A to 3B.

Figure 8:
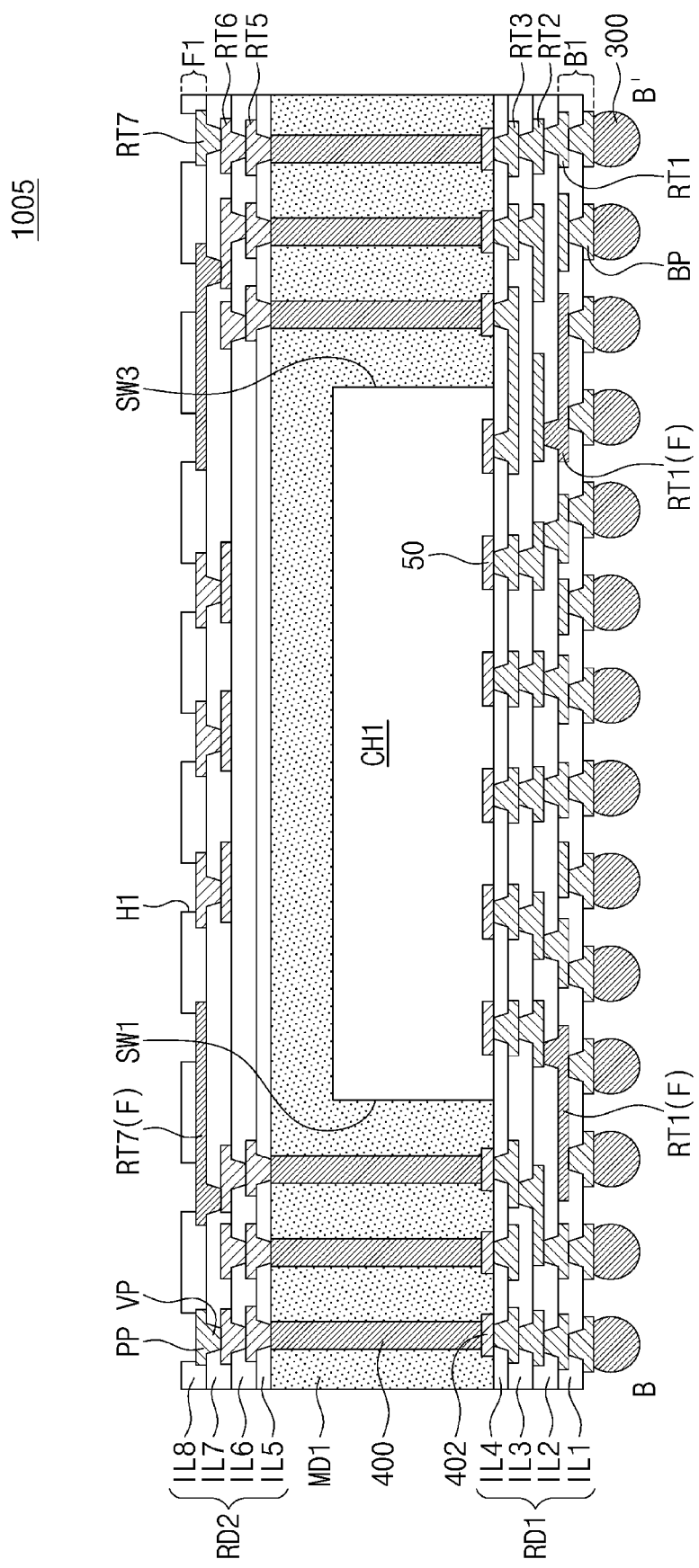
FIG. 8 illustrates a cross-sectional view taken along line B-B' of FIG. 1A or 1B.

FIG. 8 illustrates a cross-sectional view taken along line B-B' of FIG. 1A or 1B.

Referring to FIG. 8, a semiconductor package 1005 according to the present embodiment may be shaped like a chip-first type fan-out wafer level package (FOWLP). The semiconductor package 1005 may not include the connection substrate 900 of FIG. 2A or FIG. 2B. The first redistribution substrate RD1 may be provided thereon with connection pads 402 in contact with the third redistribution patterns RT3 adjacent to opposite sides of the first semiconductor device CH1. The connection pads 402 may be provided thereon with conductive pillars 400. The conductive pillars 400 may penetrate the first mold layer MID and may connect the first redistribution substrate RD1 to the second redistribution substrate RD2. The connection pads 402 and the conductive pillars 400 may include or may be formed of metal, such as copper, tin, lead, silver, aluminum, gold, and nickel. Other configurations may be identical or similar to those discussed with reference to FIGS. 1A to 3B.

Figure 9:
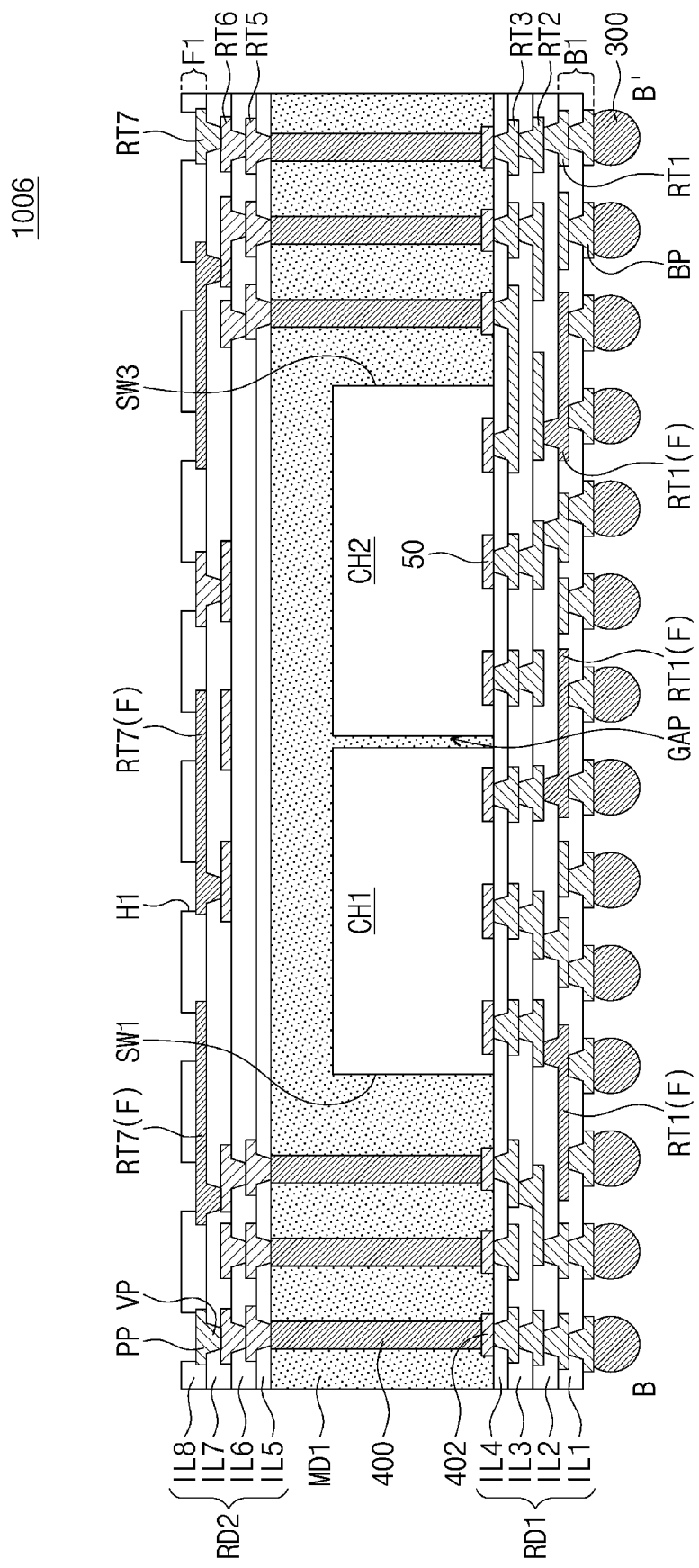
FIG. 9 illustrates a cross-sectional view taken along line B-B' of FIG. 1A or 1B.

FIG. 9 illustrates a cross-sectional view taken along line B-B' of FIG. 1A or 1B.

Referring to FIG. 9, a semiconductor package 1006 according to the present embodiment may be configured such that a first semiconductor device CH1 and a second semiconductor device CH2 are mounted side by side on the first redistribution substrate RD1 of FIG. 8. The second semiconductor device CH2 may be the same as or different from the first semiconductor device CH1. For example, the second semiconductor device CH2 may be one selected from an image sensor chip such as CMOS image sensor (CIS), a microelectromechanical system (MEMS) device chip, an application specific integrated circuit (ASIC) chip, and a memory device chip such as a flash memory, a dynamic random access memory (DRAM), a static random access memory (SRAM), an electrically erasable programmable read-only memory (EEPROM), a phase change random access memory (PRAM), a magneto-resistive random access memory (MRAM), a resistive random access memory (ReRAM), a high bandwidth memory (HBM), and a hybrid memory cubic (HMC).

The first-level lower reinforcement pattern RT1(F) may overlap a region GAP between the first semiconductor device CH1 and the second semiconductor device CH2. The first-level lower reinforcement pattern RT1(F) may overlap the first semiconductor device CH1, the second semiconductor device CH2, and the first mold layer MD1 between the first and second semiconductor devices CH1 and CH2. The first-level lower reinforcement pattern RT1(F) that overlaps the region GAP may be in contact with a plurality of lower bonding pads BP.

The first-level upper reinforcement pattern RT7(F) may overlap the region GAP between the first semiconductor device CH1 and the second semiconductor device CH2. The first-level upper reinforcement pattern RT7(F) may overlap the first semiconductor device CH1, the second semiconductor device CH2, and the first mold layer MD1 between the first and second semiconductor devices CH1 and CH2. The first-level upper reinforcement pattern RT7(F) that overlaps the region GAP may be exposed to a plurality of upper pad holes H1 formed at the eighth redistribution dielectric layer IL8.

Other configurations may be identical or similar to those discussed with reference to FIGS. 1A to 3B. The first-level lower reinforcement pattern RT1(F) and the first-level upper reinforcement pattern RT7(F) may prevent crack from occurring between the first semiconductor device CH1 and the second semiconductor device CH2.

Figure 10:
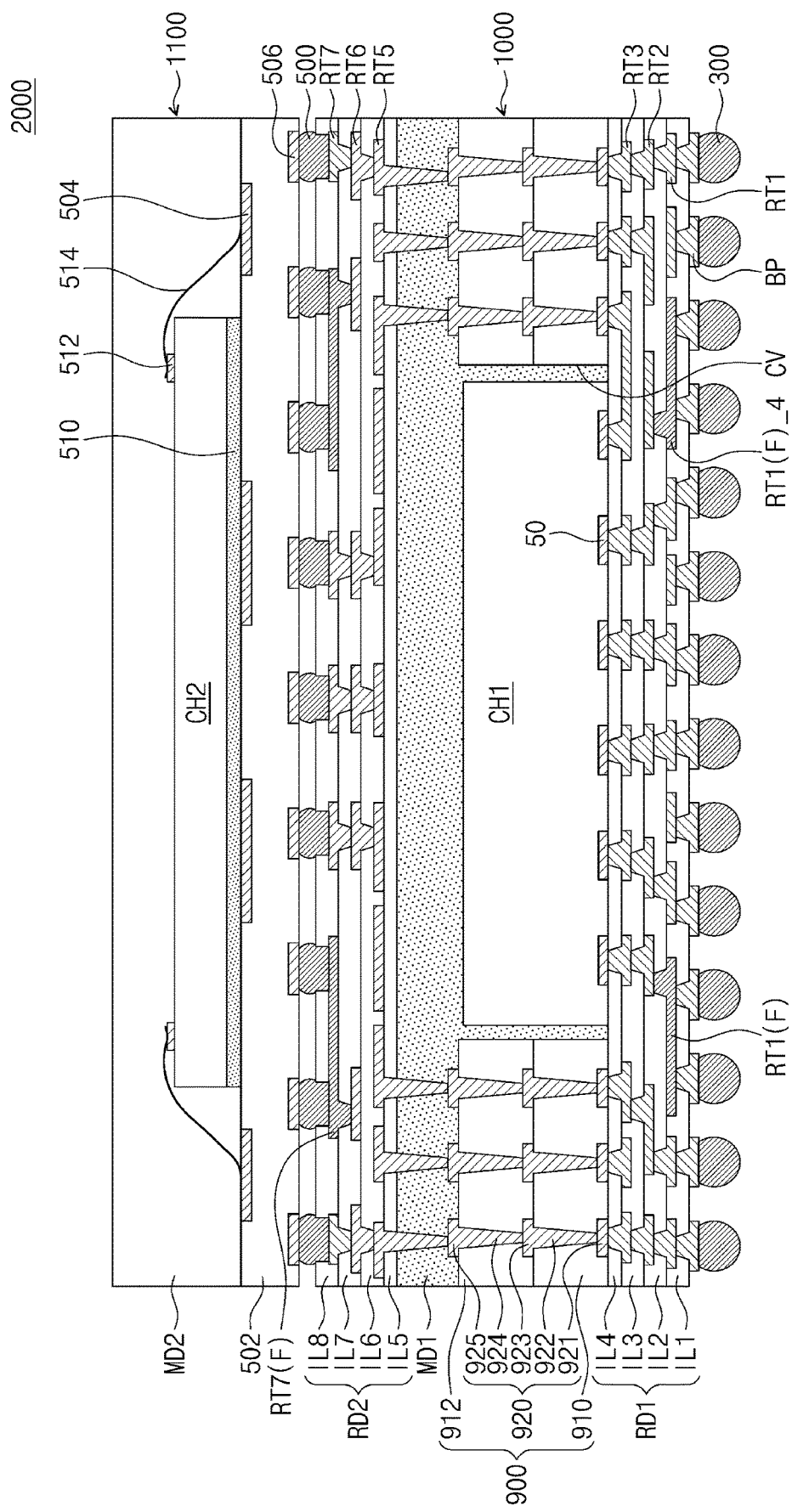
FIG. 10 illustrates a cross-sectional view taken along line B-B' of FIG. 1A or 1B.

FIG. 10 illustrates a cross-sectional view taken along line B-B' of FIG. 1A or 1B.

Referring to FIG. 10, a semiconductor package 2000 according to the present embodiment may have a package-on-package structure in which an upper semiconductor package 1100 is mounted on the semiconductor package 1000 of FIG. 2B. The upper semiconductor package 1100 may be electrically connected through inner connection terminals 500 to the seventh redistribution patterns RT7 of the semiconductor package 1000. The upper semiconductor package 1100 may include an upper package substrate 502, a second semiconductor device CH2 mounted on the upper package substrate 502, and a second mold layer MD2 that covers the second semiconductor device CH2. The upper package substrate 502 may be a double-sided printed circuit board or a multi-layered printed circuit board. The upper package substrate 502 may have upper conductive pads 504 on a top surface of the upper package substrate 502 and lower conductive pads 506 on a bottom surface of the upper package substrate 502. The second semiconductor device CH2 may be bonded through an adhesion layer 510 to the upper package substrate 502. A plurality of second chip pads 512 may be disposed on a top surface of the second semiconductor device CH2. The second semiconductor device CH2 may be connected through wires 514 to the upper package substrate 502. Other configurations may be identical or similar to those discussed with reference to FIGS. 1A to 3B. In the present embodiment, although the semiconductor package 1000 of FIG. 2B is used as a lower semiconductor package, one of the semiconductor packages 1001 to 1006 of FIGS. 4 to 6 may take the place of the semiconductor package 1000 of FIG. 2B.

A semiconductor package according to the present inventive concepts may include a reinforcement pattern that overlaps an edge of a semiconductor device included in the semiconductor package, with the result that the semiconductor package may avoid crack and may increase in reliability and durability. In addition, a ground voltage may be applied to the reinforcement patterns disposed across a signal line, and thus the reinforcement patterns may serve as an electromagnetic shielding to prevent electric signal noise and speed reduction, which may result in an improvement of the semiconductor package.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. The embodiments of FIGS. 1A to 10 may be combined with each other.

What is claimed is:

1. A semiconductor package, comprising:
  a first redistribution substrate;
  a semiconductor device disposed on the first redistribution substrate and having a first sidewall; and
  a mold layer that covers the semiconductor device and the first redistribution substrate,
  wherein the first redistribution substrate includes:
    a first redistribution dielectric layer;
    a first reinforcement pattern at the first redistribution dielectric layer, the first reinforcement pattern overlapping the semiconductor device and the mold layer; and
    a first bonding pad and a second bonding pad, each of the first bonding pad and the second bonding pad penetrating the first redistribution dielectric layer and contacting the first reinforcement pattern, wherein the second bonding pad is spaced apart from the first bonding pad in a first direction, wherein, when viewed in a plan view, the first sidewall extends in a second direction between the first bonding pad and the second bonding pad, wherein the first bonding pad has a first width in a second direction orthogonal to the first direction, and wherein, when viewed in the plan view, the first reinforcement pattern overlaps the first sidewall of the semiconductor device and has a second width in the second direction, the second width being greater than the first width.

2. The semiconductor package of claim 1,
wherein the first reinforcement pattern is supplied with a ground voltage or a power voltage.

3. The semiconductor package of claim 1,
wherein the second width of the first reinforcement pattern has a value between about 250 µm and about 1,300 µm.

4. The semiconductor package of claim 1,
wherein the first bonding pad overlaps the semiconductor device, and
wherein the second bonding pad overlaps the mold layer.

5. The semiconductor package of claim 1, further comprising:
a second reinforcement pattern at the first redistribution dielectric layer and spaced apart from the first reinforcement pattern in the second direction; and
a first signal line at the first redistribution dielectric layer and between the first reinforcement pattern and the second reinforcement pattern,
wherein, when viewed in the plan view, each of the first signal line and the second reinforcement pattern crosses over the first sidewall,
wherein the first signal line has a third width in the second direction, and
wherein the third width is less than the first width.

6. The semiconductor package of claim 5,
wherein the third width of the first signal line has a value between about ½5 of the second width and about ½00 of the second width.

7. The semiconductor package of claim 5,
wherein the third width of the first signal line has value between about 4 µm and about 10 µm.

8. The semiconductor package of claim 5,
wherein a ground voltage is applied to each of the first reinforcement pattern and the second reinforcement pattern.

9. The semiconductor package of claim 1, further comprising:
a plurality of external connection terminals below the first redistribution substrate,
wherein, when viewed in the plan view, the first reinforcement pattern overlaps at least two external connection terminals.

10. The semiconductor package of claim 1,
wherein, when viewed in the plan view, the first reinforcement pattern has a square shape, a rectangular shape, an L shape, or a T shape.

11. The semiconductor package of claim 1,
wherein the semiconductor device has a first corner,
wherein the first redistribution substrate further includes a second reinforcement pattern at the first redistribution dielectric layer, wherein the second reinforcement pattern overlaps the first corner, and wherein an area of the second reinforcement pattern is greater than an area of the first reinforcement pattern.

12. The semiconductor package of claim 1, further comprising:
a first signal line disposed at the first redistribution dielectric layer and spaced apart from the first reinforcement pattern,
wherein rigidity of a material included in the first reinforcement pattern is greater than rigidity of a material included in the first signal line.

13. The semiconductor package of claim 1, further comprising:
a connection substrate on the first redistribution substrate, the connection substrate having a cavity into which the semiconductor device is inserted,
wherein the first reinforcement pattern overlaps the connection substrate.

14. The semiconductor package of claim 1, further comprising:
a second redistribution substrate on the mold layer and electrically connected to the first redistribution substrate,
wherein the second redistribution substrate includes:
a second redistribution dielectric layer on the mold layer;
a second reinforcement pattern on the second redistribution dielectric layer; and
a third redistribution dielectric layer that covers the second reinforcement pattern and the second redistribution dielectric layer,
wherein the second reinforcement pattern overlaps the semiconductor device and the mold layer, and
wherein the third redistribution dielectric layer has a plurality of holes that expose the second reinforcement pattern.

15. A semiconductor package, comprising:
a first redistribution substrate;
a connection substrate disposed on the first redistribution substrate and having a cavity;
a semiconductor device inserted into the cavity and disposed on the first redistribution substrate, the semiconductor device having a first sidewall;
a mold layer that covers the connection substrate and the semiconductor device; and
a second redistribution substrate on the mold layer,
wherein the first redistribution substrate includes:
a plurality of first redistribution dielectric layers that are sequentially stacked on each other;
a first reinforcement pattern at a lowermost first redistribution dielectric layer of the plurality of first redistribution dielectric layers; and
a first bonding pad and a second bonding pad, each of the first bonding pad and the second bonding pad penetrating the lowermost first redistribution dielectric layer and directly contacting the first reinforcement pattern,
wherein the first reinforcement pattern overlaps the semiconductor device and the connection substrate,
wherein the first bonding pad is below the semiconductor device,
wherein the second bonding pad is below the connection substrate,
wherein the first reinforcement pattern has a width between about 250 µm and about 1,300 µm, and wherein when viewed in a plan view, the first reinforcement pattern overlaps the first sidewall.

16. The semiconductor package of claim 15,
wherein the second redistribution substrate includes:
  a plurality of second redistribution dielectric layers that are sequentially stacked on each other; and
  a second reinforcement pattern at an uppermost second redistribution dielectric layer of the plurality of second redistribution dielectric layers, the second reinforcement pattern being disposed between the uppermost second redistribution dielectric layer and the semiconductor device,
wherein the second reinforcement pattern overlaps the semiconductor device and the connection substrate, and
wherein the uppermost second redistribution dielectric layer has a plurality of holes that expose the second reinforcement pattern.

17. The semiconductor package of claim 15,
wherein the first redistribution substrate further includes:
  a second reinforcement pattern at the lowermost first redistribution dielectric layer and spaced apart from the first reinforcement pattern; and
  a signal pattern between the first reinforcement pattern and the second reinforcement pattern, and
wherein a ground voltage is applied to the first reinforcement pattern and the second reinforcement pattern.

18. A semiconductor package, comprising:
a first redistribution substrate;
a semiconductor device on the first redistribution substrate; and
a mold layer that covers the semiconductor device and the first redistribution substrate,
wherein the first redistribution substrate includes:
  a first redistribution dielectric layer;
  a first reinforcement pattern and a second reinforcement pattern that are on the first redistribution dielectric layer and are spaced apart from each other;
  a first bonding pad and a second bonding pad penetrating the first redistribution dielectric layer and directly contacting the first reinforcement pattern and the second reinforcement pattern, respectively; and
  a signal line at the first redistribution dielectric layer and between the first reinforcement pattern and the second reinforcement pattern,
wherein each of the first reinforcement pattern and the second reinforcement pattern overlaps the semiconductor device and the mold layer, and
wherein a ground voltage is applied to the first reinforcement pattern and the second reinforcement pattern.

19. The semiconductor package of claim 18,
wherein the semiconductor device has a first sidewall,
wherein the first reinforcement pattern, the second reinforcement pattern, and the signal line cross over the first sidewall, and
wherein each of an area of the first reinforcement pattern and an area of the second reinforcement pattern is greater than an area of the signal line.

20. The semiconductor package of claim 18,
wherein the semiconductor device has a first sidewall and a first corner,
wherein the first reinforcement pattern overlaps the first corner,
wherein the second reinforcement pattern is spaced apart from the first corner, and
wherein an area of the first reinforcement pattern is greater than an area of the second reinforcement pattern.

* * * * *